United States Patent [19]
Cheah

[11] Patent Number: 5,309,479
[45] Date of Patent: May 3, 1994

[54] LOW COST KU BAND TRANSMITTER

[75] Inventor: Jonathon Cheah, La Jolla, Calif.

[73] Assignee: Hughes Aircraft Company, Los Angeles, Calif.

[21] Appl. No.: 692,883

[22] Filed: Apr. 29, 1991

[51] Int. Cl.$^5$ .............................. H04L 27/12
[52] U.S. Cl. ........................ 375/62; 375/65; 455/112
[58] Field of Search .............. 375/62, 65, 45; 332/100; 455/112, 118, 120, 12.1

[56] References Cited

U.S. PATENT DOCUMENTS 3,854,094 12/1974 Towler ................................. 455/112
4,876,737 10/1989 Woodworth et al. ............. 455/12.1

Primary Examiner—Curtis Kuntz
Assistant Examiner—T. Ghebretinsae
Attorney, Agent, or Firm—Phyllis Y. Price; William J. Streeter; Wanda K. Denson-Low

[57] ABSTRACT

A Ku band frequency signal transmitter using a minimum of Ku band signal processing components is shown. Inexpensive generation of Ku band signals is provided by frequency multiplying high power, lower frequency signals to a final Ku band signal frequency. The transmitter generates an intermediate frequency signal from a baseband modulated signal and a high frequency local oscillator signal. The baseband signal is FSK modulated and has a constant envelope. A dividing stage reduces the baseband frequency signal to improve the spectral purity of the final Ku band output signal.

11 Claims, 1 Drawing Sheet

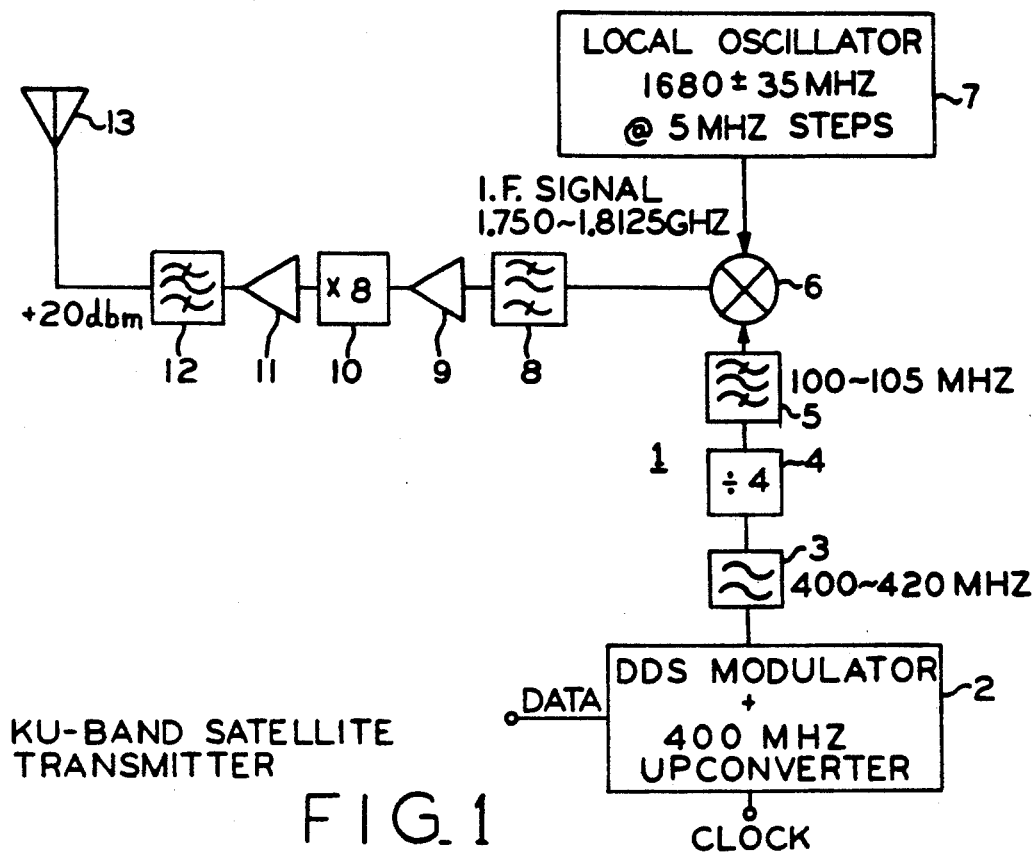
FIG_1
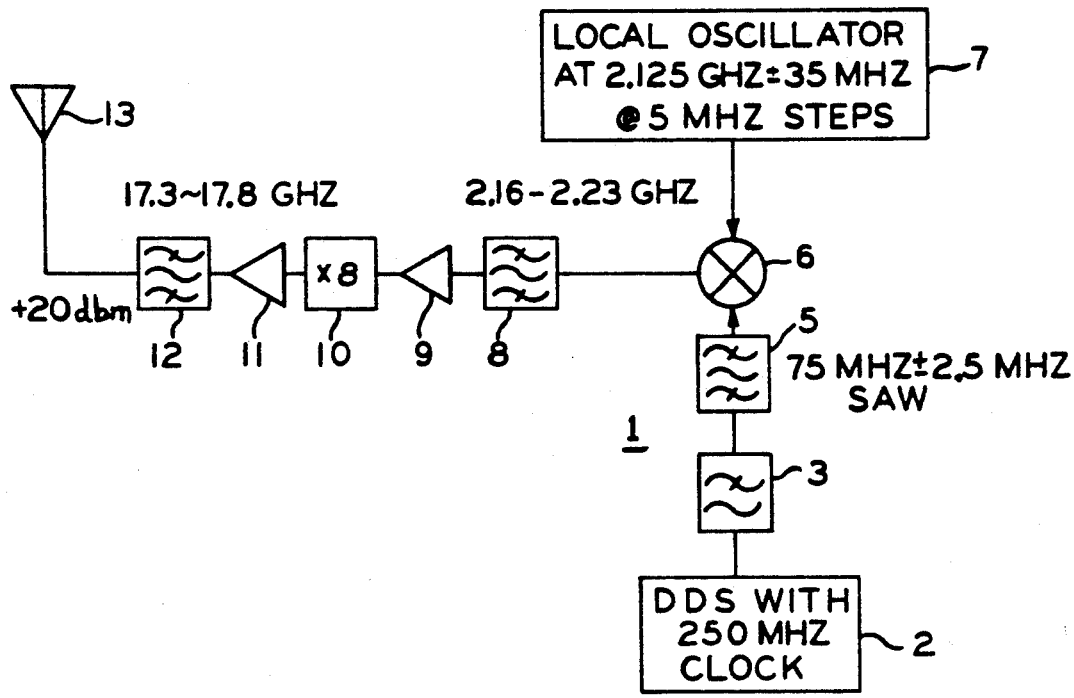
FIG_2

LOW COST KU BAND TRANSMITTER

The present invention relates to digital transmitters for very small aperture antenna earth stations. Specifically, a low cost transmitter is described for producing a Ku band FSK-modulated output signal.

Conventional satellite communication systems have employed large aperture antennas and high power transmitters for establishing an uplink to the satellite. Recently, however, very small aperture antenna earth stations have been developed for data transmission at low data rates. With these new VSAT systems, a greater number of such VSAT earth stations are provided for communicating via satellite to a hub ground base station having an antenna size and power output much larger than each of the VSAT earth station facilities.

The acceptability of the VSAT earth station concept increases as the cost for providing such earth stations decreases. The high costs associated with conventional satellite communication systems utilizing large aperture antennas and high transmit power is a serious disadvantage to the VSAT system designer, whose system depends on many such VSAT earth stations in order for the system to be viable.

As part of reducing the overall cost for the VSAT earth stations, the antenna aperture size has been reduced, thereby decreasing the cost of such earth stations. However, the problem remains that for an uplink from a VSAT earth station to a satellite transponder, sufficient power has to be generated which, in combination with the small aperture antenna, will successfully operate the satellite transponder for delivery of low data rate signals back to the hub ground base station.

These VSAT earth stations typically operate in the Ku band frequency range. Using the Ku band frequency range permits the smaller antenna sizes to be used, but a serious cost impediment is the expense of generating high level transmit power at Ku band frequencies. The hardware, i.e., conventional amplification stages, and up-conversion stages for Ku band transmitters, is an expense which significantly impacts on the total earth station cost.

Thus, it is clear that any reduction in the costs for developing Ku band transmit signals would reduce the total system costs significantly, as each of these systems contemplate many VSAT earth station installations each of which requires a Ku band uplink signal.

SUMMARY OF THE INVENTION

It is an object of this invention to provide for efficient and low-cost generation of Ku band modulated signals to serve as an earth station uplink signal.

It is a specific object of this invention to provide a transmit signal in the Ku band or higher frequency bands from high levels of lower frequency signals, generated from lower cost circuitry, thereby reducing the cost associated with Ku band transmitter circuits.

It is yet another object of this invention to provide for low cost Ku band transmit signal generation having controlled signal noise and having a frequency selectable over a Ku band frequency bandwidth.

These and other objects are provided by an apparatus and method in accordance with the invention. The invention employs the use of low frequency signal generation at power levels adequate for frequency multiplying to a Ku band frequency signal or a signal of higher frequency. The Ku band signal is processed with a minimal gain requirement, and with limited filtering demands.

In accordance with the invention, the Ku band or higher frequency signal is provided by a frequency multiplier which receives as an input signal a higher power, lower frequency signal which may be economically generated from relatively inexpensive components. As is known, the frequency multiplier provides a comb of frequencies, each being a multiple of the input low frequency signal. One of the frequencies, $f_N$, lies within the Ku band frequency spectrum. This desired frequency power can be specially optimized to enhance its output power by virtue of the multiplier design.

In a preferred embodiment of the invention, the input signal to the multiplier is provided by a heterodyne circuit, which heterodynes a lower frequency microwave signal with a modulated baseband signal. The lower frequency microwave signal is selected to provide an intermediate frequency signal for multiplication which is nominally greater than the Ku frequency band of interest. In this way, only one of the comb frequencies provided by the multiplier will at any one time lie within the Ku band frequency range of interest.

In carrying out the invention in accordance with the preferred embodiment, a direct digital synthesizer is utilized to produce the modulated baseband signal with a constant envelope. The constant envelope modulated baseband signal is mixed with the local oscillator microwave signal to derive the intermediate frequency signal as an input signal for the multiplier.

The foregoing technique minimizes spur emission and provides frequency agility such that frequencies may be selected in 1 Hz steps over a 500 MHz Ku band frequency range.

DESCRIPTION OF THE DRAWINGS

FIG. 1 is a block diagram illustrating a first embodiment of the invention.

FIG. 2 illustrates an additional embodiment of the claimed invention.

DESCRIPTION OF THE PREFERRED EMBODIMENT

Referring now to FIG. 1, there is shown a block diagram of a transmitter in accordance with the preferred embodiment of the invention. The embodiment of FIG. 1 represents a circuit for generating a transmit signal at power levels of substantially +20 dBM in the Ku band frequency range of 14.0 to 14.5 GHz. The power output from the transmitter is suitable for accessing a satellite using a standard VSAT antenna 13. The required power (plus 20 dBM) is generated with only minimal amplification at Ku band frequencies, and a minimal amount of additional signal processing.

The embodiment shown in FIG. 1 illustrates that aspect of the invention in which most of the signal generation is done at an intermediate frequency of 1.750 to 1.8125 GHz. The signals at these frequencies may be generated economically and multiplied by a multiplier 10 to a final frequency within the Ku band 14.0 to 14.56 GHz.

The multiplier 10 may be a low-cost harmonic multiplier using either a step recovery diode, varactor diode, or saturated GaASFET, as is known to skilled circuit designers. Using these multiplication devices, which are generally low cost, compared to Ku band signal generating and processing elements, will generate a comb of frequencies, at least one of which falls within the Ku band frequency range. Each of the $f_{Ni}$ frequencies constituting the comb has an amplitude theoretically inversely proportional to its rank N, where i=1 to N. A minor amount of amplification 11 is provided for the Ku band signal, where required. This may be a gain of less than 10 dB, maintaining the overall circuit cost to a minimum. The amplified signal from amplifier 11 is bandpass filtered in a filter 12. The filter 12 is designed to pass the entire Ku band transmit bandwidth. Only one of the comb signals generated by the multiplier 10 will be selected by design. In the embodiment of FIGS. 1 and 2, this is the eighth harmonic. As will become obvious when discussing the generation of the intermediate frequency signal which constitutes the input to the frequency multiplier 10, only one of the N generated harmonics from the frequency multiplier 10 will lie within the Ku bandwidth of interest, i.e., 14.0 to 14.5 GHz.

In the example shown, the intermediate frequency signal is generated at a frequency of 1.750 to 1.8125 GHz. This intermediate frequency signal has a frequency greater than the Ku bandwidth of interest, i.e., 14.0 to 14.5 GHz. The consequence of this selection means that the frequency spacing between each of the harmonics produced by the multiplier 10 will be greater than the Ku bandwidth of interest. The bandpass filter 12 will have the required bandwidth of 500 MHz, permitting selection of only one of the harmonics produced by the multiplier 10.

Generation of the intermediate frequency signal is provided by a heterodyne circuit comprising the local oscillator 7, mixer 6 and a modulation chain 1. The intermediate frequency signal is filtered by bandpass filter 8 to remove the low frequency image produced by mixer 6. This filter is selected in the embodiment shown to have a frequency passband in the range of 1.750 GHz to 1.8125 GHz. Utilizing the high frequency image permits a lower operating frequency for the local oscillator 7, which further lowers the system cost.

The signals applied to the mixer 6 comprise an FSK modulated baseband signal, as well as the local oscillator signal from local oscillator 7. The baseband signal originates from a direct digital synthesizer and 400 MHz up-converter 2. The DDS modulator and up-converter 2 provide an FSK modulated signal, up-converted to a 400 MHz baseband signal. As is known, the DDS modulators can provide a constant envelope FSK signal, wherein the data is modulated on the constant envelope signal. An anti-aliasing filter 3 is provided to remove any alias artifacts which are produced from the DDS modulator 2.

In order to maintain a low noise floor on the transmit Ku band signal, a divider 4 is provided for frequency dividing the up-converted 400 MHz signal. The presence of the divider 4 means that the total signal noise floor is only increased by a factor of 4 for the Ku band generated signal, i.e., total multiplication factor 2 to the second power ($2^2$).

The divided baseband signal is further filtered in a bandpass filter having a bandwidth covering approximately 100 to 105 MHz to remove any harmonics generated from dividing the baseband signal.

Using a constant envelope FSK modulation scheme, having a modulation index greater than 1, permits the local oscillator 7 phase noise requirements to be very modest, hence the associated costs for the oscillator 7 are reduced. The combined conventional DDS modulator 2 and the local oscillator 7 permit a frequency selection of the final Ku band signal to be controlled to within a 1 Hz step size over the 500 megacycle bandwidth of interest.

The foregoing embodiment contemplates the use of various types of digital modulation having a constant envelope. This would include without limitation all M-ARY frequency shift keying techniques with or without phase coherency, and includes minimum shift keying and all its subsets.

As an alternative embodiment, FIG. 2 illustrates an embodiment wherein the divider 4 may be effectively eliminated. Higher spur emission levels can be expected from the Ku band signal of approximately 18 dB. However, in applications where this higher spur level can be tolerated, the cost reductions are obvious.

In a system not using a divider 4, the digital data synthesizer is implemented without the need for the 400 MHz up-conversion stage. With the DDS operating from a 250 MHz clock, it is possible to generate a signal having a nominal frequency of 75 megacycles, and a deviation of ±2.5 MHz.

In this configuration, it is intended that a final upper Ku band frequency of between 17.3 and 17.8 GHz would be realized. To do so, the nominal frequency of the local oscillator 7 must be set at 2.125 GHz and the bandpass SAW filter 5 must be centered at 75 MHz. The anti-aliasing filter 3 would be adapted to remove the image produced and the bandpass filter 8 would be adapted to remove the lower frequency image produced by the mixer 6.

As with the foregoing embodiment, the intermediate frequency signal lying between the range of 2.16 and 2.23 GHz will be greater than the 500 MHz bandwidth of interest. This will avoid the problem of recovering more than one of the harmonic frequencies generated by the multiplier 10.

Thus, there is described with respect to two embodiments, a transmitter which will provide Ku band or higher frequency transmit signals at a reduced cost. Costly Ku band components are kept at a minimum, while employing the lesser cost, higher power, lower frequency components. Those skilled in the art will recognize yet other embodiments described by the claims which follow.

What is claimed is:

1. A transmitter for producing a range of high power high frequency modulated signals comprising:
   a local oscillator for providing a local oscillator signal having a selectable frequency greater than the frequency bandwidth of said high frequency modulated signals;
   a digital data synthesizer modulator for providing a modulated constant envelope signal in response to a data signal and a clock signal;
   a heterodyne circuit connected to receive a signal from said digital data synthesizer modulator and said local oscillator signal from said local oscillator, for producing a frequency converted, intermediate frequency signal; and,
   a frequency multiplier for multiplying said converted intermediate frequency signal to said high frequency modulated signals.

2. The transmitter of claim 1 further comprising an image rejecting filter for filtering said intermediate frequency signal.

3. The transmitter of claim 2 further comprising a bandpass filter for filtering said high frequency modulated signals.

4. The transmitter of claim 3 wherein said load oscillator signal has a frequency greater than said bandpass filter bandwidth.

5. The transmitter of claim 1 wherein said digital modulator comprises:
   a direct digital synthesis modulator for receiving a data signal, and a clock signal;
   an anti-aliasing filter for filtering said modulated constant envelope signal from said direct digital synthesis modulator to provide a filtered modulated signal;
   a frequency divider for frequency dividing said filtered modulator signal from said anti-aliasing filter; and,
   a harmonic filter for removing harmonics of said frequency divided signal.

6. The transmitter according to claim 5 wherein said modulated constant envelope signal produced by said direct digital synthesis modulator is a frequency shift keyed signal.

7. The transmitter according to claim 6 wherein said direct digital synthesis modulator provides an M-ARY frequency shift keyed signal.

8. A method for generating high power high frequency modulated signals comprising the steps of:
   generating a frequency shift keyed baseband signal from an input data signal and a clock signal;
   frequency dividing said frequency shift keyed baseband signal for reducing spurious artifact signals contained in said frequency shift keyed baseband signal;
   frequency converting said frequency divided baseband signal to an intermediate frequency signal; and,
   frequency multiplying said intermediate frequency signal to a final transmit signal frequency.

9. The method of claim 8 further comprising the step of bandpass filtering said final transmit signal, limiting said transmit signal bandwidth.

10. The method of claim 8 further comprising the step of filtering said intermediate frequency signal to remove image frequency signals of said intermediate frequency signal.

11. The method of claim 9 wherein said intermediate frequency signal has a frequency greater than said transmit signal bandpass frequency bandwidth.

* * * * *

UNITED STATES PATENT AND TRADEMARK OFFICE
CERTIFICATE OF CORRECTION

PATENT NO. : 5,309,479

DATED : May 3, 1994

INVENTOR(S) : Jonathon Cheah

It is certified that error appears in the above-identified patent and that said Letters Patent is hereby corrected as shown below:

Column 5, claim 4, line 5 should read:

--The transmitter of claim 3 wherein said local oscil- --.

Signed and Sealed this

Twenty-ninth Day of November, 1994

*Attest:*

BRUCE LEHMAN

*Attesting Officer*     *Commissioner of Patents and Trademarks*